United States Patent
Yun

(10) Patent No.: US 9,362,752 B2
(45) Date of Patent: *Jun. 7, 2016

(54) PHOTOVOLTAIC POWER GENERATION SYSTEM

(71) Applicant: LG Electronics Inc., Seoul (KR)

(72) Inventor: Juhwan Yun, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/586,591

(22) Filed: Dec. 30, 2014

(65) Prior Publication Data

US 2015/0114449 A1  Apr. 30, 2015

Related U.S. Application Data

(63) Continuation of application No. 13/051,600, filed on Mar. 18, 2011, now Pat. No. 8,952,569.

(30) Foreign Application Priority Data

Mar. 23, 2010  (KR) .......................... 10-2010-0025722

(51) Int. Cl.

| | | |
|---|---|---|
| H02J 1/00 | (2006.01) | |
| H02J 3/00 | (2006.01) | |
| H02J 3/38 | (2006.01) | |
| G05F 1/67 | (2006.01) | |
| H01L 31/02 | (2006.01) | |
| H02S 40/30 | (2014.01) | |

(52) U.S. Cl.
CPC . *H02J 3/385* (2013.01); *G05F 1/67* (2013.01); *H01L 31/02021* (2013.01); *H02S 40/30* (2014.12); *Y02E 10/58* (2013.01); *Y10T 307/653* (2015.04); *Y10T 307/729* (2015.04)

(58) Field of Classification Search
CPC .... H02J 3/383; H02J 3/385; H01L 31/02021; Y02E 10/58; Y02E 10/50
USPC .................................................. 307/71, 82, 86
See application file for complete search history.

(56) References Cited

U.S. PATENT DOCUMENTS

| 5,327,071 A | 7/1994 | Frederick et al. |
|---|---|---|
| 5,669,987 A | 9/1997 | Takehara et al. |
| 6,225,793 B1 | 5/2001 | Dickmann |
| 8,952,569 B2 * | 2/2015 | Yun .......................... G05F 1/67 307/86 |
| 2007/0107767 A1 | 5/2007 | Hayden et al. |
| 2008/0150366 A1 | 6/2008 | Adest et al. |
| 2009/0195081 A1 | 8/2009 | Quardt et al. |

FOREIGN PATENT DOCUMENTS

| DE | 199 16 742 C1 | 8/2000 |
|---|---|---|
| KR | 10-2006-0087957 A | 8/2006 |

(Continued)

*Primary Examiner* — Carlos Amaya
(74) *Attorney, Agent, or Firm* — Birch, Stewart, Kolasch & Birch, LLP

(57) ABSTRACT

A photovoltaic power generation system is discussed. The photovoltaic power generation system includes a solar cell module including a plurality of solar cell groups divided into groupings of the plurality of solar cell groups, each of the plurality of solar cell groups including at least one of one solar cell row which a plurality of solar cells are electrically connected, and a plurality of signal control units connected to the plurality of solar cell groups, respectively, wherein the each of the plurality of signal control units track a maximum power based on the current and the voltage output from each of the plurality of solar cell groups and outputs the maximum power.

2 Claims, 5 Drawing Sheets

(56) References Cited

FOREIGN PATENT DOCUMENTS

| KR | 10-0633996 B1 | 10/2006 |
| KR | 10-2007-0033395 A | 3/2007 |
| KR | 10-2008-0092747 A | 10/2008 |
| KR | 10-0908156 B1 | 7/2009 |
| WO | WO 2006/079503 A2 | 8/2006 |
| WO | WO 2008/121266 A2 | 10/2008 |

* cited by examiner

PHOTOVOLTAIC POWER GENERATION SYSTEM

This application is a continuation of co-pending U.S. application Ser. No. 13/051,600 filed on Mar. 18, 2011, which claims priority to and the benefit of Korean Patent Application No. 10-2010-0025722 filed in the Korean Intellectual Property Office on Mar. 23, 2010. The contents of all of these applications are hereby incorporated by reference as fully set forth herein in their entirety.

BACKGROUND OF THE INVENTION

1. Field of the Invention

Example embodiments of the invention relate to a photovoltaic power generation system.

2. Description of the Related Art

Recently, as existing energy sources such as petroleum and coal are expected to be depleted, interests in renewable energy sources for replacing the existing energy sources are increasing. Among the renewable energy sources, solar cells for generating electric energy from solar energy have been particularly spotlighted.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

The solar cell may be individually used, or the plurality of solar cells having the same structure may be connected in series or in parallel to one another to manufacture a solar cell module for efficient use and easy installation. Accordingly, a desired number of solar cell modules may be connected to one another to manufacture a module array, i.e., a solar cell panel. A user may obtain electric power from the solar cell panel.

SUMMARY OF THE INVENTION

In one aspect, there is a photovoltaic power generation system including a solar cell module having a plurality of solar cell row groups, a plurality of sensing units respectively connected to the plurality of solar cell row groups, each of the plurality of sensing units being connected to a corresponding solar cell row group, and being configured to sense a signal output from the corresponding solar cell row group and output a sensing signal, a plurality of amplification units respectively connected to the plurality of solar cell row groups, and a signal control unit configured to detect amounts of currents output from the plurality of solar cell row groups in response to the sensing signals output from the plurality of sensing units, control a plurality of control signals respectively applied to the plurality of amplification units based on the detected amounts of currents, track a maximum power based on a voltage and a current output from the solar cell module, and output the maximum power, wherein each of the plurality of amplification units is connected to the corresponding solar cell row group, and amplifies a current to a predetermined amplification level determined based on one of the plurality of control signals from the signal control unit and applies the amplified current to an input terminal of the corresponding solar cell row group.

Each of the plurality of sensing units may sense the signal as an amount of current output from the corresponding solar cell row group.

The signal control unit may read the amount of current sensed by each of the plurality of sensing units, compare the amount of sensed current with a setting value, and control the control signal applied to each of the plurality of amplification units based on a difference between the amount of sensed current and the setting value.

The signal control unit may increase a magnitude of each control signal as the difference between the amount of sensed current and the setting value increases.

Each of the plurality of control signals may be a voltage.

Each of the plurality of solar cell row groups may have at least one row of solar cells.

The plurality of solar cell row groups may be connected in series to one another.

In one aspect, there is a photovoltaic power generation system including a solar cell module having a plurality of solar cell row groups, a plurality of sensing units respectively connected to the plurality of solar cell row groups, each of the plurality of sensing units being connected to a corresponding solar cell row group, and being configured to sense a signal output from the corresponding solar cell row group and output a sensing signal, a plurality of amplification units respectively connected to the plurality of solar cell row groups, and a plurality of signal control units, each of which is connected to a corresponding sensing unit, to a corresponding amplification unit, and to the corresponding solar cell row group, and is configured to detect an amount of current output from the corresponding solar cell row group in response to the sensing signal output from the corresponding sensing unit, track a maximum power based on a voltage and a current output from the corresponding amplification unit or the corresponding solar cell row group based on the detected amount of the current, and output the maximum power, wherein each of the plurality of amplification units is connected to the corresponding solar cell row group, and amplifies a current to a predetermined amplification level determined based on a control signal from the corresponding signal control unit and applies the amplified current to an input terminal of the corresponding solar cell row group.

When each of the plurality of signal control units determines that the corresponding solar cell row group is outputting less than a particular amount of current based on the sensing signal from the corresponding sensing unit, each of the plurality of signal control units may track the maximum power using the current and the voltage output from the corresponding amplification unit and may output the maximum power.

Each of the plurality of sensing units may sense the signal as an amount of current output from the corresponding solar cell row group.

Each of the plurality of signal control units may read the amount of current sensed by the corresponding sensing unit, compares the amount of sensed current with a setting value, and may control the control signal applied to a corresponding amplification unit based on a difference between the amount of sensed current and the setting value.

Each of the plurality of signal control units may increase a magnitude of the corresponding control signal as the difference between the amount of sensed current and the setting value increases.

Each of the control signals may be a voltage.

Each of the plurality of solar cell row groups may have a plurality of solar cells connected in series to one another.

In one aspect, there is a photovoltaic power generation system including a solar cell module having a plurality of solar cell row groups, a plurality of signal control units respectively connected to the plurality of solar cell row groups, each of the plurality of signal control units being connected to a corresponding solar cell row group and being configured to track a maximum power based on a current and a voltage output from the corresponding solar cell row group and output the maximum power, and a final power output unit configured to select a largest power among the maximum powers output from the plurality of signal control units as a final power and output the final power.

In one aspect, there is a photovoltaic power generation system including a plurality of solar cell modules each including a plurality of solar cells, a plurality of signal control units respectively connected to the plurality of solar cell modules, each of the plurality of signal control units being connected to a corresponding solar cell module and being configured to track a maximum power based on a current and a voltage output from the corresponding solar cell module and output the maximum power, and a final power output unit configured to select a largest power among the maximum powers output from the plurality of signal control units as a final power and output the final power.

In one aspect, there is a photovoltaic power generation system including a plurality of solar cell modules each including a plurality of solar cells, a plurality of amplification units respectively connected to the plurality of solar cell modules, each of the plurality of amplification units being connected to a corresponding solar cell module and being configured to amplify a voltage output from the corresponding solar cell module connected to each amplification unit to a predetermined magnitude, a plurality of signal control units respectively connected to the plurality of solar cell modules and the plurality of amplification units, each of the plurality of signal control units being connected to the corresponding solar cell module, being connected to a corresponding amplification unit, and being configured to track a maximum power based on a current output from the corresponding solar cell module, the amplified voltage output from the corresponding amplification unit and output the maximum power, and a final power output unit configured to select a largest power among the maximum powers output from the plurality of signal control units as a final power and output the final power.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
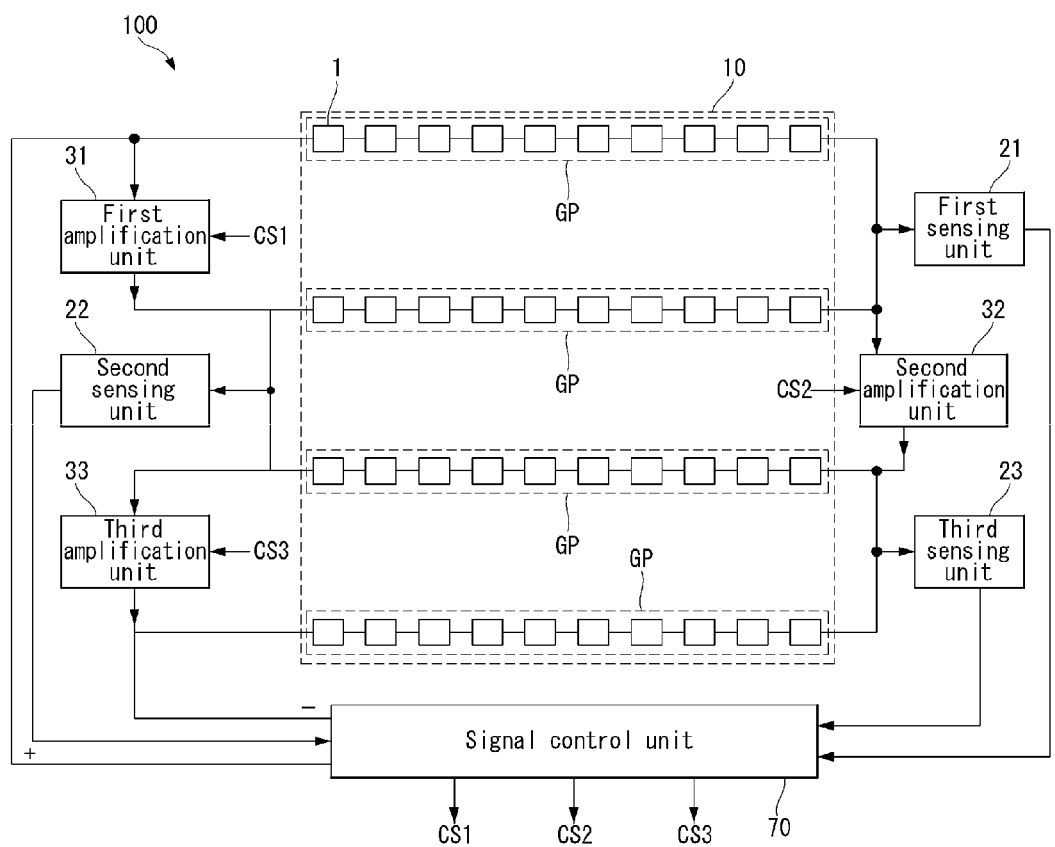
FIG. 1 is a schematic block diagram of a photovoltaic power generation system according to an example embodiment of the invention.

The invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is a schematic block diagram of a photovoltaic power generation system according to an example embodiment of the invention.

As shown in FIG. 1, a photovoltaic power generation system 100 according to an example embodiment of the invention includes a solar cell module 10, a plurality of sensing units 21 to 23 connected to the solar cell module 10, a plurality of amplification units 31 to 33 connected to the solar cell module 10, and a signal control unit 70 connected to the plurality of sensing units 21 to 23 and the plurality of amplification units 31 to 33.

The solar cell module 10 includes a plurality of solar cells 1, and the plurality of solar cells 1 are connected in series to one another using electron electrodes and hole electrodes. Such series connected plurality of solar cells 1 may be referred to as a solar cell row group. Although FIG. 1 illustrates the solar cells 1 having a structure of a 10×4 matrix, the number of solar cells 10 may increase or decrease, and may differ, if necessary or desired.

The plurality of sensing units 21-23 include the first to third sensing units 21 to 23. Each of the sensing units 21-23 is connected between two adjacent rows of solar cells 1 and the signal control unit 70. More specifically, as shown in FIG. 1, an input terminal of the first sensing unit 21 is connected between the first and second rows of solar cells 1, and an output terminal of the first sensing unit 21 is connected to the signal control unit 70. An input terminal of the second sensing unit 22 is connected between the second and third rows of solar cells 1, and an output terminal of the second sensing unit 22 is connected to the signal control unit 70. An input terminal of the third sensing unit 23 is connected between the third and fourth rows of solar cells 1, and an output terminal of the third sensing unit 23 is connected to the signal control unit 70.

Each of the sensing units 21-23 receives a signal output from a previous row to a next row of the two adjacent rows of solar cells 1.

As above, because each of the sensing units 21-23 is positioned between the two adjacent rows of the solar cells 1, the number of sensing units may vary depending on the number of solar cell rows arranged in the solar cell module 10.

Each of the sensing units 21-23 senses (detects or determines) signals (for example, current) received from each of the two adjacent rows of solar cells connected to each sensing unit and outputs a sensing signal corresponding to an amount of sensed signals (for example, an amount of sensed current) to the signal control unit 70.

The plurality of amplification units 31-33 include the first to third amplification units 31 to 33. Each of the amplification units 31-33 is connected between the two adjacent rows of solar cells 1 and the signal control unit 70. More specifically, as shown in FIG. 1, an input terminal of the first amplification unit 31 is connected between the first and second rows of solar cells 1, and an output terminal of the first amplification unit 31 is connected to the signal control unit 70. An input terminal of the second amplification unit 32 is connected between the second and third rows of solar cells 1, and an output terminal of the second amplification unit 32 is connected to the signal control unit 70. An input terminal of the third amplification unit 33 is connected between the third and fourth rows of solar cells 1, and an output terminal of the third amplification unit 33 is connected to the signal control unit 70. The first to third amplification units 31-33 may be disposed opposite the corresponding first to third sensing units 21-23, respectively, in an alternating manner. For example, as shown in FIG. 1, the first amplification unit 31 may be disposed on one side between the first and second rows of solar cells 1, and the first sensing unit 21 may be disposed on the other side between the first and second rows of solar cells 1. A relationship between the sensing units 21-23 and the amplification units 31-33 may vary.

The first to third amplification units 31-33 receive control signals CS1-CS3 from the signal control unit 70, respectively. Hence, operations of the first to third amplification units 31-33 may vary depending on the control signals CS1-CS3. Each of the first to third amplification units 31-33 amplifies a signal applied to its input terminal to a predetermined amplification level and outputs the amplified signal to its output terminal. The amplification level of each of the first to third amplification units 31-33 may vary depending on magnitudes of the control signals CS1-CS3.

The signal control unit 70 controls the magnitudes of the control signals CS1-CS3 applied to the first to third amplification units 31-33 based on the sensing signals from the first to third sensing units 21-23. The signal control unit 70 senses electric power generated in the solar cell module 10.

An operation of the photovoltaic power generation system 100 having the above-described structure is described below.

When solar light is incident on the solar cell module 10, electrons and holes corresponding to an amount of incident solar light are produced by the operation of each solar cell 1 of the solar cell module 10. The electrons and holes move to the solar cells 1, that are connected in series to one another using electron electrodes and hole electrodes. Hence, the current and the voltage each having a predetermined magnitude are generated in the adjacent rows of solar cells 1 and the solar cells 1 connected in series to one another in zigzag, or an alternating manner. For example, a voltage of about 0.5 V and a current of about 8 A are generated in each solar cell 1.

The first to third sensing units 21-23 sense the current flowing in each of the rows of solar cells 1. In other words, the first sensing unit 21 senses the current flowing in the first row of solar cells 1, the second sensing unit 22 senses the current flowing in the second row of solar cells 1, and the third sensing unit 23 senses the current flowing in the third row of solar cells 1. Each of the first to third sensing units 21-23 outputs the sensing signal having a magnitude corresponding to the amount of sensed current to the signal control unit 70.

When the serial connection between the solar cells 1 arranged in at least one of the rows is severed (or disconnected) or a shade phenomenon (or shading) occurs, in which at least one of the solar cells 1 arranged in at least one of the rows is covered by a pollution material (or debris) such as leaves, dust, and soil, the disconnected or shaded solar cells 1 cannot perform a normal energy generation operation, such as producing a particular amount or level of energy. Thus, when at least one of the solar cells 1 arranged in at least one of the rows is disconnected or shaded, an amount of current output from the disconnected or shaded solar cell 1 is reduced because the plurality of solar cells 1 are connected in series to one another. A reduced amount of current may vary depending on degrees of the shade and the disconnection of the solar cell 1.

For example, when the shade phenomenon is generated in one solar cell 1 arranged in the first row, the current generated in the one shaded solar cell 1 may be reduced to about 4 A. In this instance, because a voltage output from each of the solar cells 1 belonging to the first row is uniformly about 0.5 V, the total voltage output from the solar cells 1 belonging to the first row is 5V (=0.5×10 (the number of solar cells belonging to the first row)). However, the current output from the first row is reduced from about 8 A to about 4 A. Hence, the voltage and the current output from the solar cell module 10 are about 20V (=5V×4 (the number of solar cell rows)) and about 4 A, respectively. As a result, the power output from the solar cell module 10 is about 80 W (=20V×4 A) which is lower than about 160 W (=20V×8 A) obtained in a normal operation of the solar cells 1.

Accordingly, the signal control unit 70 senses an amount of current flowing in each solar cell row using the sensing signals output from the first to third sensing units 21-23, so as to decide (or determine) a location of the solar cell row including the disconnected or shaded solar cell and a reduced amount of current. For this, the signal control unit 70 reads the sensing signals output from the first to third sensing units 21-23 to decide (or determine) the amount of current sensed in each solar cell row. Further, the signal control unit 70 compares the amount of sensed current with an amount of current in the normal state to decide (or determine) the solar cell row including the solar cell that is abnormally operating (or outputting a lower amount of current than a particular amount).

For example, when the signal control unit 70 reads the sensing signal output from the first sensing unit 21 as an abnormal signal (or below a certain amount), the signal control unit 70 decides that the at least one disconnected or shaded solar cell is included in the first row. When the signal control unit 70 reads the sensing signal output from the second sensing unit 22 as an abnormal signal, the signal control unit 70 decides that the at least one disconnected or shaded solar cell is included in the second row. When the signal control unit 70 reads the sensing signal output from the third sensing unit 22 as an abnormal signal, the signal control unit 70 decides that the at least one disconnected or shaded solar cell is included in the third row.

Next, the signal control unit 70 outputs one or more of the control signals CS1-CS3 to the respective first to third amplification units 31-33 depending on the signals from the one or more of the sensing units 21-23. The magnitude of each of the control signals CS1-CS3, for example, the voltage magnitude, may vary depending on the magnitude of each of the sensing signals output from the first to third sensing units 21-23. For example, as the magnitudes of the sensing signals output from the first to third sensing units 21-23 increase (i.e., as the amount of current flowing in the solar cell row corresponding to each of the first to third sensing units 21-23 increases), the magnitudes of the control signals CS1-CS3 respectively corresponding to the first to third amplification units 31-33 decrease.

In the embodiment, each of the first to third amplification units 31-33 may be an amplifier including a transistor, etc. The amplification level of the signal (for example, the current) output from the input terminal to the output terminal of each of the first to third amplification units 31-33 may vary depending on the control signals CS1-CS3 respectively applied to the output terminals of the first to third amplification units 31-33. Accordingly, each of the first to third amplification units 31-33 amplifies the current applied to the input terminal thereof based on the magnitude of each of the control signals CS1-CS3 and outputs the amplified current to the output terminal thereof.

For example, when the at least one problem solar cell (for example, the at least one disconnected or shaded solar cell) is included in the first solar cell row, the signal control unit 70 determines the magnitude of the first control signal CS1 based on the reduced amount of current decided (or determined) by the sensing signal from the first sensing unit 21. The signal control unit 70 then outputs the first control signal CS1 having the magnitude corresponding to the reduced amount of current to the first amplification unit 31. Thus, the first amplification unit 31 amplifies the current applied to the first solar cell row to (or based on) the magnitude of the first control signal CS1 and then applies the amplified current to the second solar cell row. In the same manner as the first solar cell row, when the at least one problem solar cell is included in the second solar cell row, the signal control unit 70 outputs the second control signal CS2 having the magnitude determined by the sensing signal from the second sensing unit 22 to the second amplification unit 32. Hence, the second amplification unit 32 amplifies the current applied to the second solar cell row to (or based on) the magnitude of the second control signal CS2 and then applies the amplified current to the third solar cell row. In the same manner as the first solar cell row, when the at least one problem solar cell is included in the third solar cell row, the signal control unit 70 outputs the third control signal CS3 having the magnitude determined by the sensing signal from the third sensing unit 23 to the third amplification unit 33. Hence, the third amplification unit 33 amplifies the current applied to the third solar cell row to (or based on) the magnitude of the third control signal CS3 and then applies the amplified current to the fourth solar cell row. In this instance, because the amplification unit related to the solar cell row not including the problem solar cell does not operate, the current sequentially passes through all of the solar cells 1 included in each row and normally flows.

As above, even if the solar cell row including the at least one problem solar cell exists in the solar cell module 10, the amplification units 31-33 compensate for the reduced amount of current through the amplification operation. Therefore, because the power output from the solar cell module 10 increases in proportion to the amount of compensated current, the output efficiency of the solar cell module 10 is improved.

When the power is generated in the solar cell module 10 through such a current compensation operation, an output amount of power of the solar cell module 10 may vary depending on time or season. The power generated in each solar cell 1 may vary depending on an amount of incident light. For example, an amount of power produced when an intensity of light is the strongest in a day may be the maximum amount of power produced in a day. Further, an amount of power produced in summer, in which an intensity of light is stronger than other seasons and sunshine hours are longer than other seasons, may be more than other seasons.

Accordingly, the signal control unit 70 performs a maximum power point tracking (MPPT) control operation for tracking a maximum power among the powers generated in the solar cell module 10.

For example, the signal control unit 70 detects in real-time analog signal type current and analog signal type voltage generated in the solar cell module 10 at each sampling time. The signal control unit 70 converts the analog signal type current and voltage into digital signal type current and voltage and calculates power using the digital signal type current and the digital signal type voltage. Then, the signal control unit 70 compares a previous power calculated at a previous sampling time with a current power calculated at a current sampling time and selects the largest power among the previous power and the current power. In other words, the signal control unit 70 calculates the current power at each sampling time, compares the previous power with the current power, and detects a maximum power point. The signal control unit 70 selects the maximum power point as a final power (or final output power) of the solar cell module 10 and outputs the final power to a subsequent device including a digital-to-analog converter (DAC), a capacitor, etc.

In the embodiment, the first to third sensing units 21-23 and the first to third amplification units 31-33 sense the amount of current of each solar cell row, and the signal control unit 70 controls the operation of the first to third amplification units 31-33 based on the sensed amount of current. Alternatively, the sensing unit and the amplification unit may be installed in each of solar cell row groups each including two or more solar cell rows.

Figure 2:
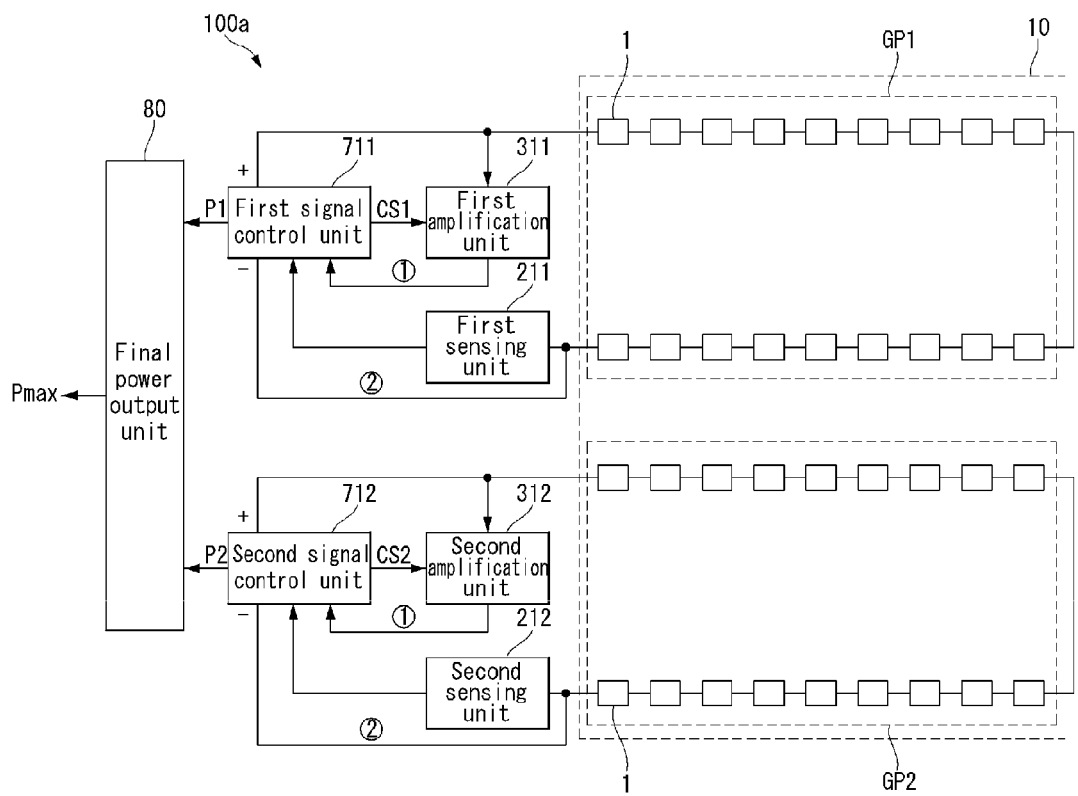
FIG. 2 is a schematic block diagram of a photovoltaic power generation system according to another example embodiment of the invention.

FIG. 2 is a schematic block diagram of a photovoltaic power generation system according to another example embodiment of the invention. Structures and components identical or equivalent to those illustrated in FIG. 1 are designated in FIG. 2 with the same reference numerals, and a further description may be briefly made or may be entirely omitted.

A photovoltaic power generation system 100a shown in FIG. 2 has the structure similar to the photovoltaic power generation system 100 shown in FIG. 1. More specifically, the photovoltaic power generation system 100a includes a solar cell module 10 including a plurality of solar cells 1, a plurality of sensing units 211 and 212 connected to the solar cell module 10, a plurality of amplification units 311 and 312 connected to the solar cell module 10, and a plurality of signal control units 711 and 712 connected to the plurality of sensing units 211 and 212 and the plurality of amplification units 311 and 312.

On the other hand, unlike the photovoltaic power generation system 100 shown in FIG. 1 in which all of the solar cells 1 included in the solar cell module 10 are connected in series to one another, in the photovoltaic power generation system 100a shown in FIG. 2, a plurality of solar cell rows are divided into a plurality of solar cell row groups GP1 and GP2 each including a predetermined number of solar cell rows, for example, two solar cell rows. Further, the solar cells 1 belonging to each of the solar cell row groups GP1 and GP2 are connected in series to one another, but the solar cells 1 belonging to the first solar cell row group GP1 are electrically separated from the solar cells 1 belonging to the second solar cell row group GP2.

Accordingly, the plurality of sensing units 211 and 212 and the plurality of amplification units 311 and 312 are connected to the corresponding solar cell row groups GP1 and GP2. More specifically, as shown in FIG. 2, the first sensing unit 211 is positioned between an output terminal of the first solar cell row group GP1 and the first signal control unit 711, and the second sensing unit 212 is positioned between an output terminal of the second solar cell row group GP2 and the second signal control unit 712. Further, the first amplification unit 311 is positioned between an input terminal of the first solar cell row group GP1 and the first signal control unit 711, and the second amplification unit 312 is positioned between an input terminal of the second solar cell row group GP2 and the second signal control unit 712.

As described above, the first signal control unit 711 is connected to the first solar cell row group GP1, the first sensing units 211, and the first amplification units 311. The second signal control unit 712 is connected to the second solar cell row group GP2, the second sensing units 212, and the second amplification units 312.

The number of solar cell row groups may vary depending on the number of solar cell rows belonging to one solar cell module 10, and the number of solar cell rows belonging to one solar cell row group may increase or decrease, if necessary or desired. Thus, the number of sensing units and the number of amplification units may vary depending on the number of solar cell row groups.

The photovoltaic power generation system 100a according to the embodiment of the invention further includes a final power output unit 80 connected to the first and second signal control units 711 and 712.

The final power output unit 80 selects the largest power among maximum powers P1 and P2 respectively applied to the first and second signal control units 711 and 712 as a final power Pmax and outputs the final power Pmax to a subsequent device.

An operation of the photovoltaic power generation system 100a having the above-described structure is described below.

Operations of the solar cells 1 belonging to the first solar cell row group GP1, the first sensing unit 211, the first amplification unit 311, and the first signal control unit 711 are substantially the same as operations of the solar cells 1 belonging to the second solar cell row group GP2, the second sensing unit 211, the second amplification unit 312, and the second signal control unit 712. Therefore, only the operations related to the first solar cell row group GP1 are described in the embodiment of the invention, and a further description of the operations related to the second solar cell row group GP2 may be briefly made or may be entirely omitted.

When each of the solar cells 1 of the solar cell module 10 operates through the incidence of solar light to generate voltage and current each having the corresponding magnitude, the first sensing unit 211 senses an amount of current flowing in the first solar cell row group GP1 and outputs the sensed amount of current to the first signal control unit 711.

The first signal control unit 711 controls a magnitude of a control signal CS1 applied to the first amplification unit 311 in response to a sensing signal from the first sensing unit 211. As described above with reference to FIG. 1, the first signal control unit 711 controls the magnitude of the first control signal CS1 based on the reduced amount of current decided by the sensing signal from the first sensing unit 21 and controls the operation of the first amplification unit 311 using the first control signal CS1. For example, as the reduced amount of current of the first solar cell row group GP1 increases compared with an amount of current obtained when the solar cells 1 belonging to the first solar cell row group GP1 normally operate without the disconnection or the shade phenomenon, the magnitude of the first control signal CS1 increases. Hence, an amplification level of the first amplification unit 311 increases. As the reduced amount of current of the first solar cell row group GP1 decreases, the magnitude of the first control signal CS1 decreases. Hence, the amplification level of the first amplification unit 311 decreases. When the amount of current obtained when the solar cells 1 of the first solar cell row group GP1 normally operate is substantially equal to an amount of sensed current (i.e., when the reduced amount of current is about zero), the first signal control unit 711 blocks the output (or does not output) of the first control signal CS1 to thereby stop the operation of the first amplification unit 311.

When the first amplification unit 311 operates in response to the first control signal CS1, the first signal control unit 711 decides that the first amplification unit 311 is in an operation state so as to compensate for a reduction in the amount of current resulting from the abnormal operation of at least one solar cell 1 of the first solar cell row group GP1. Thus, the first signal control unit 711 reads a signal output through a path ① passing through the first amplification unit 311 as the current of the first solar cell row group GP1. In this instance, the voltage output from the first amplification unit 311 is already determined to be substantially equal to the voltage applied to an output terminal of the first solar cell row group GP1.

On the other hand, when the first amplification unit 311 does not operate, the first signal control unit 711 decides that all of the solar cells 1 of the first solar cell row group GP1 normally operate. Thus, the first signal control unit 711 reads the current and the voltage applied through a path ② passing through the output terminal of the first solar cell row group GP1.

Next, the first signal control unit 711 calculates power at each sampling time using the current and the voltage applied in real-time through the path ① or ②. The first signal control unit 711 compares a current power with a previous power and performs a MPPT control operation for tracking a maximum power P1. Sequentially, the first signal control unit 711 outputs the determined maximum power P1 to the final power output unit 80.

The second signal control unit 712 calculates a maximum power P2 of the second solar cell row group GP2 in the same manner as the first signal control unit 711 and then outputs the maximum power P2 to the final power output unit 80.

The final power output unit 80 selects the largest power among the maximum powers P1 and P2 respectively obtained from the first and second solar cell row groups GP1 and GP2 as a final power Pmax. The final power output unit 80 then outputs the final power Pmax to a subsequent device.

In the embodiment of the invention, because the plurality of solar cell rows are divided into the plurality of solar cell row groups GP1 and GP2 and the reduced amount of current in the solar cell row groups GP1 and GP2 is individually compensated by individually controlling the solar cell row groups GP1 and GP2, the output efficiency of the solar cell module 10 is improved.

Further, in the embodiment of the invention, the MPPT control operation is individually performed on the solar cell row groups GP1 and GP2, the maximum powers P1 and P2 are respectively tracked in the solar cell row groups GP1 and GP2, and the final power Pmax is selected among the maximum powers P1 and P2. Thus, the output efficiency of the solar cell module 10 is further improved.

Figure 3:
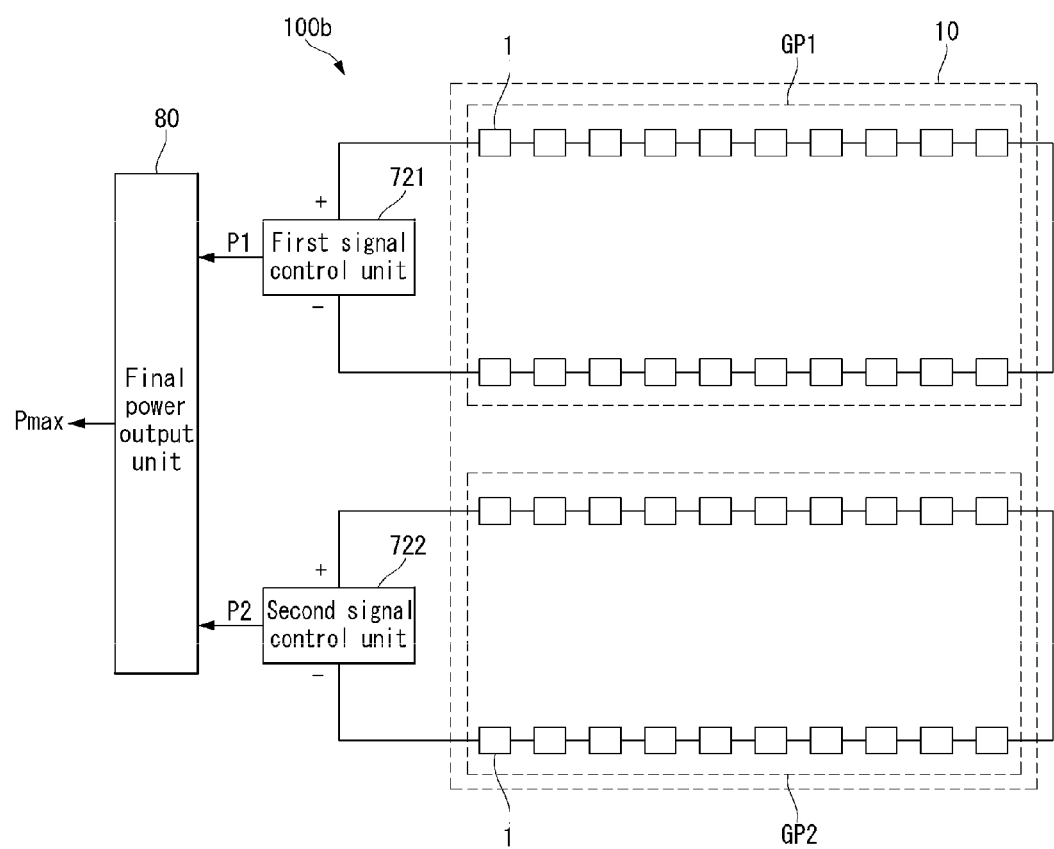
FIG. 3 is a schematic block diagram of a photovoltaic power generation system according to another example embodiment of the invention.

FIG. 3 is a schematic block diagram of a photovoltaic power generation system according to another example embodiment of the invention. Structures and components identical or equivalent to those illustrated in FIG. 2 are designated in FIG. 3 with the same reference numerals, and a further description may be briefly made or may be entirely omitted.

A photovoltaic power generation system 100b shown in FIG. 3 has the same structure as the photovoltaic power generation system 100a shown in FIG. 2, except that the photovoltaic power generation system 100b does not have a sensing unit and an amplification unit connected to each of solar cell row groups GP1 and GP2. More specifically, the photovoltaic power generation system 100b shown in FIG. 3 includes a first signal control unit 721 connected between a hole terminal (+) and an electron terminal (−) of the first solar cell row group GP1, and a second signal control unit 722 connected between a hole terminal (+) and an electron terminal (−) of the second solar cell row group GP2.

An operation of the photovoltaic power generation system 100b having the above-described structure is described below.

Similar to the photovoltaic power generation system 100a shown in FIG. 2, an operation of the first signal control unit 721 connected to the first solar cell row group GP1 is substantially the same as an operation of the second signal control unit 722 connected to the second solar cell row group GP2. Therefore, only the operation of the first signal control unit 721 is described in the embodiment of the invention, and a further description of the operation of the second signal control unit 722 may be briefly made or may be entirely omitted.

When current and voltage are generated in the first solar cell row group GP1 through operations of the solar cells 1 belonging to the first solar cell row group GP1, the current and the voltage are applied to the first signal control unit 721. Then, the first signal control unit 721 converts the current and the voltage into digital type current and digital type voltage.

Next, the first signal control unit 721 receives in real-time the digital type current and voltage from the first solar cell row group GP1 and performs the MPPT control operation described above with reference to FIG. 2.

Accordingly, the first signal control unit 721 reads current and voltage at each sampling time using the currents and the voltages received in real-time from the first solar cell row group GP1 and calculates power at each sampling time. The first signal control unit 721 compares a current power with a previous power and calculates a maximum power P1 of the first solar cell row group GP1. The first signal control unit 721 then outputs the maximum power P1 to a final power output unit 80.

The second signal control unit 722 calculates a maximum power P2 of the second solar cell row group GP2 in the same manner as the first signal control unit 721 and then outputs the maximum power P2 to the final power output unit 80.

The final power output unit 80 selects the largest power among the maximum powers P1 and P2 respectively obtained from the first and second solar cell row groups GP1 and GP2 as a final power Pmax. The final power output unit 80 then outputs the final power Pmax to a subsequent device.

In the embodiment of the invention, the MPPT control operation is individually performed on the first and second solar cell row groups GP1 and GP2, the maximum powers P1 and P2 are respectively tracked in the first and second solar cell row groups GP1 and GP2, and the final power Pmax is selected among the maximum powers P1 and P2. Thus, the output efficiency of the solar cell module 10 is improved.

Figure 4:
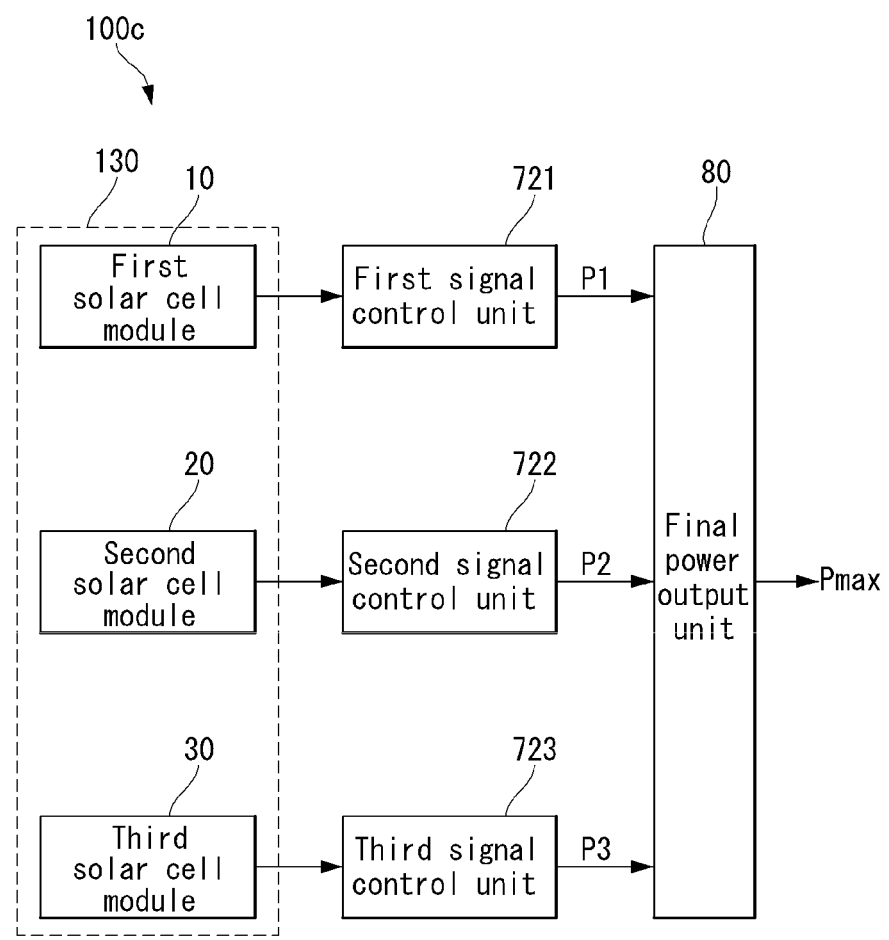
FIG. 4 is a schematic block diagram of a photovoltaic power generation system according to another example embodiment of the invention.

FIG. 4 is a schematic block diagram of a photovoltaic power generation system according to another example embodiment of the invention. Structures and components identical or equivalent to those illustrated in FIGS. 3 and 4 are designated with the same reference numerals, and a further description may be briefly made or may be entirely omitted.

A photovoltaic power generation system 100c shown in FIG. 4 includes a plurality of signal control units 721 to 723 respectively connected to a plurality of solar cell modules 10 and a final power output unit 80 connected to the plurality of signal control units 721 to 723.

The plurality of solar cell modules 10 to 30 form a solar cell panel 130. As described above, each of solar cell modules 10 to 30 includes a plurality of solar cells that are arranged in a matrix structure and are connected in series to one another An operation of the photovoltaic power generation system 100c having the above-described structure is described below.

Since operations of the first to third signal control units 721 to 723 are substantially the same as one another, only the operation of the first signal control unit 721 is described in the embodiment of the invention. A further description of the operations of the second and third signal control units 722 and 723 may be briefly made or may be entirely omitted.

When a current and a voltage each having a corresponding magnitude are output from the first solar cell module 10 by operating the solar cells included in the first solar cell module 10, the first signal control unit 721 converts the current and the voltage output in real-time from the first solar cell module 10 into digital type current and digital type voltage. The first signal control unit 721 decides states of the current and the voltage output in real-time from the first solar cell module 10.

Next, the first signal control unit 721 receives in real-time the current and the voltage from the first solar cell module 10 and performs the MPPT control operation based on the current and the voltage output from the first solar cell module 10.

Accordingly, the first signal control unit 721 reads current and voltage at each sampling time using the current and the voltage received in real-time from the first solar cell module 10 and calculates power at each sampling time. The first signal control unit 721 compares a current power with a previous power and calculates a maximum power P1 of the first solar cell module 10. The first signal control unit 721 then outputs the maximum power P1 to a final power output unit 80.

The second and third signal control units 722 and 723 respectively calculate maximum powers P2 and P3 of the second and third solar cell modules 10 in the same manner as the first signal control unit 721 and then respectively output the maximum powers P2 and P3 to the final power output unit 80.

The final power output unit 80 selects the largest power among the maximum powers P1 to P3 respectively obtained from the first to third solar cell modules 10 to 30 as a final power Pmax. The final power output unit 80 then outputs the final power Pmax to a subsequent device.

In the embodiment of the invention, the MPPT control operation is individually performed on the first to third solar cell modules 10 to 30, the maximum powers P1 to P3 are respectively tracked in the first to third solar cell modules 10 to 30, and the final power Pmax is selected among the maximum powers P1 to P3. Thus, the output efficiencies of the solar cell modules 10 to 30 are improved.

Figure 5:
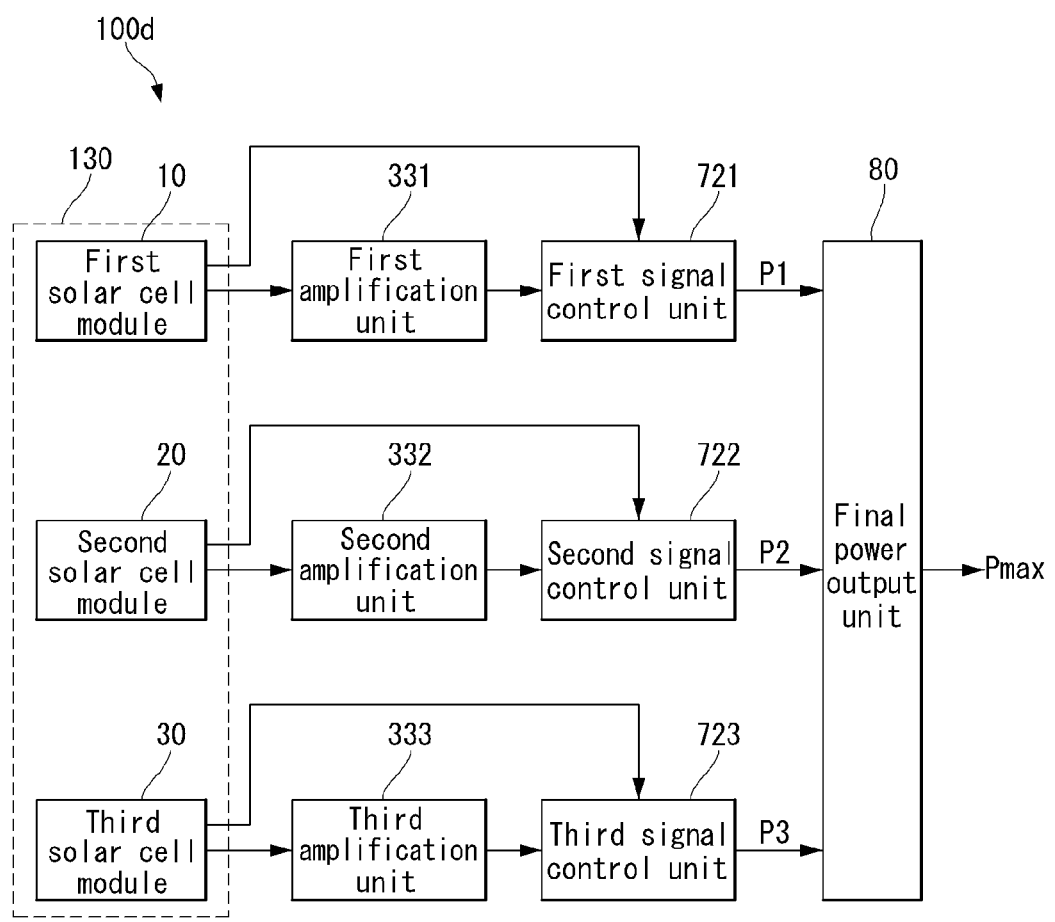
FIG. 5 is a schematic block diagram of a photovoltaic power generation system according to another example embodiment of the invention.

FIG. 5 is a schematic block diagram of a photovoltaic power generation system according to another example embodiment of the invention. Structures and components identical or equivalent to those illustrated in FIGS. 4 and 5 are designated with the same reference numerals, and a further description may be briefly made or may be entirely omitted.

A photovoltaic power generation system 100d shown in FIG. 5 includes a plurality of amplification units 331 to 333 respectively connected to a plurality of solar cell modules 10 to 30, a plurality of signal control units 721 to 723 respectively connected to the plurality of amplification units 331 to 333, and a final power output unit 80 connected to the plurality of signal control units 721 to 723.

An operation of the photovoltaic power generation system 100d having the above-described structure is described below.

Since operations of the first to third signal control units 721 to 723 are substantially the same as one another, only the operation of the first signal control unit 721 is described in the embodiment of the invention. A further description of the operations of the second and third signal control units 722 and 723 may be briefly made or may be entirely omitted.

When a current and a voltage each having a corresponding magnitude are output from the first solar cell module 10 by operating the solar cells included in the first solar cell module 10, the first amplification unit 331 amplifies in real-time the voltage output in real-time from the first solar cell module 10 to a previously determined magnitude and outputs the amplified voltage to the first signal control unit 721. The first signal control unit 721 receives in real-time the current from the first solar cell module 10.

Next, the first signal control unit 721 converts the current and the voltage into digital type current and digital type voltage. The first signal control unit 721 decides states of the current and the voltage output in real-time from the first solar cell module 10.

Next, the first signal control unit 721 receives in real-time the current and the voltage from the first solar cell module 10 and performs the MPPT control operation based on the current and the voltage output from the first solar cell module 10.

Accordingly, the first signal control unit 721 reads current and voltage at each sampling time using the currents and the voltages received in real-time from the first solar cell module 10 and calculates a current power at each sampling time. The first signal control unit 721 compares the current power with a previous power and calculates a maximum power P1 of the first solar cell module 10. The first signal control unit 721 then outputs the maximum power P1 to the final power output unit 80.

The second and third signal control units 722 and 723 respectively calculate maximum powers P2 and P3 of the second solar cell module 20 and third solar cell module 30, respectively, in the same manner as the first signal control unit 721 and then respectively output the maximum powers P2 and P3 to the final power output unit 80.

The final power output unit 80 selects the largest power among the maximum powers P1 to P3 respectively obtained from the first to third solar cell modules 10 to 30 as a final power Pmax. The final power output unit 80 then outputs the final power Pmax to a subsequent device.

In the embodiment of the invention, because the voltage output from each of the first to third solar cell modules 10 to 30 is amplified to the predetermined magnitude, the power output from each of the first to third solar cell modules 10 to 30 may increase. Hence, the amplified final power Pmax is output from the final power output unit 80. As a result, the final power Pmax greater than power generated in a solar cell panel 130 may be obtained.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cell groups divided into groupings of the plurality of solar cell groups, each of the plurality of solar cell groups including at least one of one solar cell row which a plurality of solar cells are electrically connected;
a plurality of signal control units connected to the plurality of solar cell groups, respectively; each of the plurality of signal control units tracking a maximum power based on a current and a voltage output from the each of the plurality of solar cell groups and outputting the maximum power;
a plurality of sensing units connected between the each of the plurality of solar cell groups and the each of the plurality of signal control units, sensing currents output from the plurality of solar cell groups, and outputting the sensed currents to the plurality of signal control units; and
a plurality of amplification units connected between the each of the plurality of solar cell groups and the each of the plurality of signal control units;
wherein the each of the plurality of signal control units compares an amount of current sensed by the each of the plurality of sensing units with a setting value, and applies a control signal to a corresponding amplification unit of the plurality of amplification units, when the amount of current is less than the setting value, the corresponding amplification unit corresponding to a sensing unit which outputs the amount of current less than the setting value, and
the corresponding amplification unit amplifies a current input thereto and outputs the amplified current to an output terminal of a signal control unit of the plurality of signal control units.

2. The solar cell module of claim 1, further comprising a final power output unit to be connected to the plurality of signal control units,
wherein the final power output unit selects the largest power among maximum powers respectively applied to the plurality of signal control units.

* * * * *